United States Patent [19]

Beilstein, Jr. et al.

[11] Patent Number: 5,260,952
[45] Date of Patent: Nov. 9, 1993

[54] FAULT TOLERANT LOGIC SYSTEM

[75] Inventors: Kenneth E. Beilstein, Jr., Essex; John A. Fifield, Underhill; Lawrence G. Heller, So. Burl.; Hsing-San Lee, Essex Jct.; Charles H. Stapper, Jericho, all of Vt.

[73] Assignee: IBM Corporation, Armonk, N.Y.

[21] Appl. No.: 693,509

[22] Filed: Apr. 30, 1991

[51] Int. Cl.[5] .......................................... G01K 31/28
[52] U.S. Cl. .......................................... 371/63; 371/81
[58] Field of Search ............... 371/63, 57.1, 7, 8.1, 371/11.1; 365/201

[56] References Cited

U.S. PATENT DOCUMENTS

| | | |
|---|---|---|
| 4,358,823 | 11/1982 | McDonald et al. . |
| 4,464,756 | 6/1984 | Tromborg ........................... 371/63 |
| 4,566,417 | 4/1984 | Kirkpatrick et al. . |
| 4,570,084 | 2/1986 | Griffin et al. . |
| 4,638,482 | 1/1987 | Griffin et al. . |
| 4,686,392 | 8/1987 | Lo . |
| 4,700,346 | 10/1987 | Chaudran et al. ...................... 371/67 |
| 4,709,166 | 11/1987 | Banker et al. . |
| 4,719,629 | 1/1988 | Wang . |
| 4,727,313 | 2/1988 | Barazilai et al. . |
| 4,739,498 | 4/1988 | Eichhorn . |

Primary Examiner—Vincent P. Canney
Attorney, Agent, or Firm—Sughrue, Mion, Zinn, Macpeak & Seas

[57] ABSTRACT

A logic system including a first logic block for providing first differential outputs; a second logic block, identical to the first logic block, for providing second differential outputs; a fault detecting device, coupled to the first logic block, for detecting a fault in the first differential outputs; and a selecting device, coupled to the first and second logic blocks and to the fault detecting device, for selecting an output of one of the first and second logic blocks depending on whether the fault detecting device detects a fault.

20 Claims, 4 Drawing Sheets

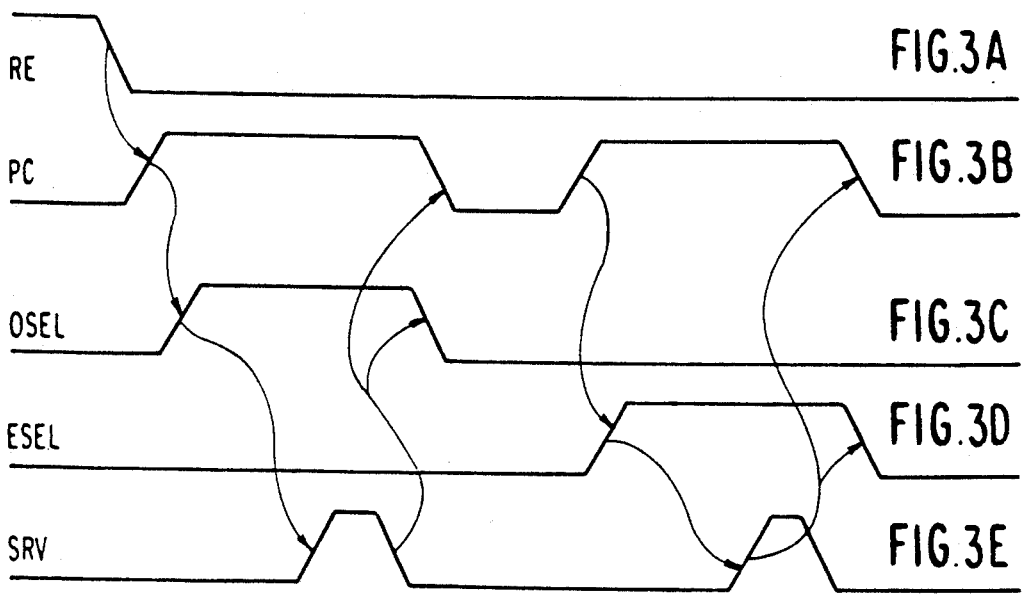
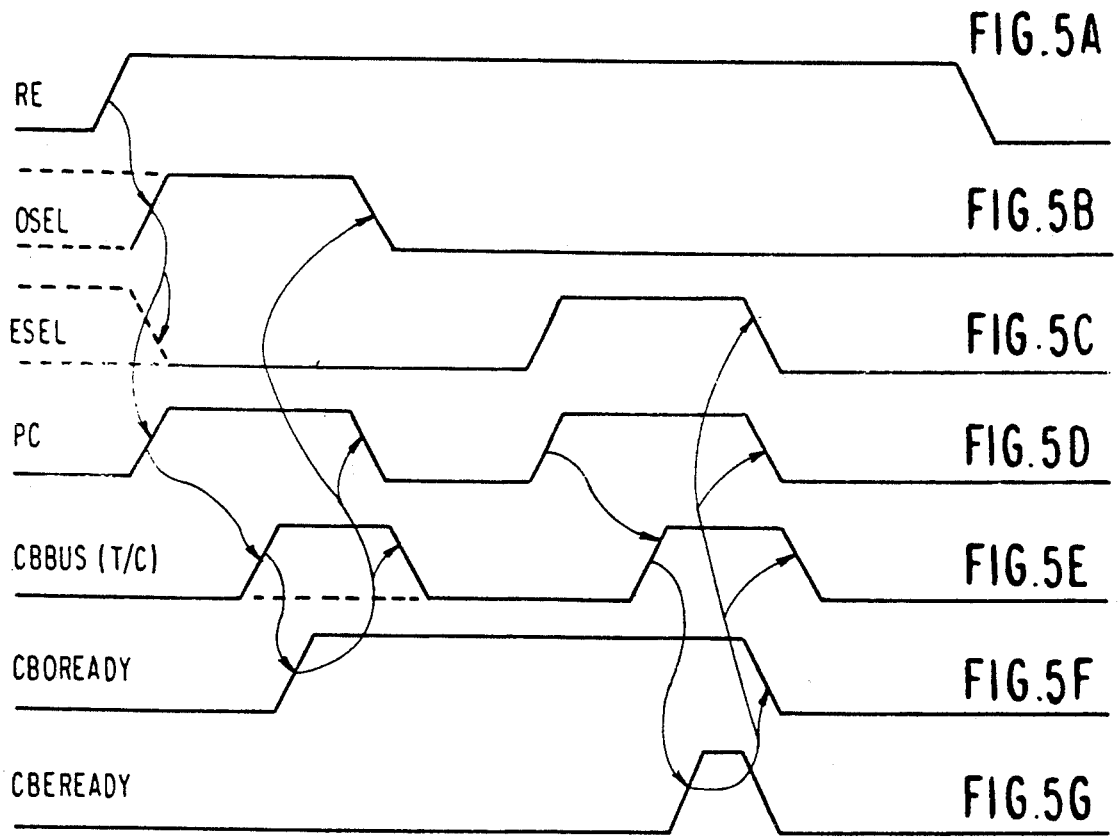

FAULT TOLERANT LOGIC SYSTEM

FIELD OF THE INVENTION

The present invention relates to fault tolerant systems and, more particularly, to fault tolerant systems utilizing differential logic outputs.

BACKGROUND OF THE INVENTION

A common approach to fault tolerant system designs involves employing redundant or spare logic units. In one such approach, the system is designed to include five identical logic units which operate in parallel, and the respective outputs of the units are polled to determine correct output data. Specifically, if the results of the poll reveal that at least three of the five units output identical data, then such identical data is assumed correct. While this approach will provide relatively accurate output data, the approach is disadvantageous since it requires employing five separate units each of which is designed to output the same data.

In another approach, the fault tolerant system employs only two units which operate in parallel. In this system, the respective outputs of the two units are compared, and if they do not match, then a known signature is employed through both systems in an attempt to determine the correct and faulty outputs. This system is also disadvantageous in that several cycles must be performed when the unit outputs do not match, thereby decreasing the operating speed of the system.

The following references are examples of fault detection logic systems.

IBM Technical Disclosure Bulletin, Vol. 27, No. 10B, pages 6148-6152, March 1985, discloses a Differential Cascode Voltage Switch (DCVS) circuit in which outputs of DCVS circuit trees are tested for faults.

U.S. Pat. No. 4,638,482 discloses a system for testing a differential logic network. The system includes both a differential exclusive OR gate having several inputs for receiving complementary signals from a differential logic network, and also a conventional exclusive OR gate, coupled to receive the outputs of the differential exclusive OR gate, for detecting the presence of a fault or error in the differential logic network.

U.S. Pat. No. 4,739,498 discloses a system including both an error detector circuit for detecting a fault in a device, and also a switching arrangement for switching from the detected defective device to a redundant duplicate device.

U.S. Pat. No. 4,358,823 discloses a double redundant processor system including first and second master processors for processing data. When one of the first and second master processors is active, the other processor is in a standby mode. The system further includes an alarm monitor which in response to an error signal, deactivates the active master processor and activates the standby master processor.

U.S. Pat. No. 4,727,313 discloses a method of simulating a DCVS circuit. In the method, various faults are simulated by holding selected internal signals of the circuit at faulty values.

U.S. Pat. No. 4,719,629 discloses an error correction circuit including redundant logic NOR circuits.

U.S. Pat. No. 4,570,084 discloses a differential logic circuit.

U.S. Pat. Nos. 4,709,166; 4,686,392 and 4,656,417 disclose further examples of cascode logic circuits.

SUMMARY OF THE INVENTION

An object of the invention is to provide a fault tolerant system in which only one spare or redundant unit is necessary.

It is another object of the invention to provide a fault tolerant system which operates at a high speed.

Another object of the invention is to provide a fault tolerant system which can accurately detect faults.

Another object of the invention is to provide an ECC logic system which includes only a single redundant logic block and which provides accurate output data.

Still another object of the invention is to provide a fault tolerant system which provides an increased chip manufacturing yield.

These and other objects are achieved by the present invention which includes:

first logic block means for providing first differential outputs;

second logic block means for providing second differential outputs, said second logic block means being identical to said first logic block means;

fault detection means, coupled to said first logic block means, for detecting a fault from the first differential outputs; and selection means, coupled to said first and second logic block means, for selecting an output of one of said first and second logic block means in accordance with whether the fault detection means detects a fault.

BRIEF DESCRIPTION OF THE DRAWINGS

FIGS. 3(A)-3(E) are timing diagrams for the fetch operation of FIG. 2.

FIGS. 5(A)-5(G) are timing diagrams for the write back operation of FIG. 4.

DETAILED DESCRIPTION OF PREFERRED EMBODIMENTS

Figure 1:
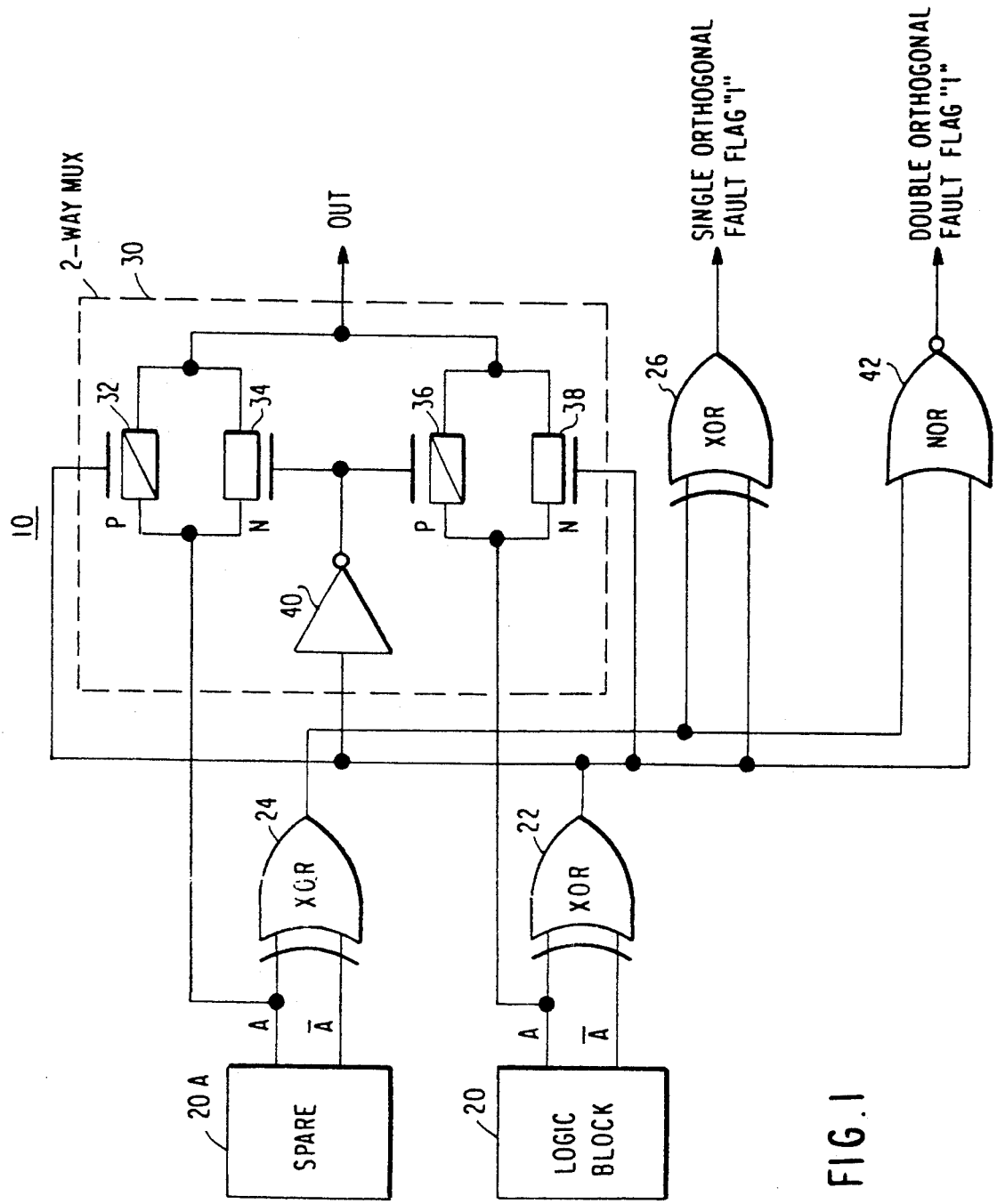
FIG. 1 is a block diagram showing an error correction logic system according to a first embodiment of the invention.

FIG. 1 shows a fault tolerant logic system according to a first embodiment of the invention. As shown in FIG. 1, the system 10 includes a first differential logic block 20, a second spare differential logic block 20a which is identical to the first logic block 20, an exclusive OR (XOR) gate 22 connected to receive the differential outputs of logic block 20, an Exclusive OR gate 24 connected to receive the differential outputs of spare logic block 20a, and a two-way multiplexer 30 including P-type MOS transistors 32 and 36, N-type MOS transistors 34 and 38, and an inverter 40. The system 10 further includes an exclusive OR gate 26 and a NOR gate 42 each of which is connected to receive the outputs of exclusive OR gates 22 and 24. The operation of system 10 will now be explained by way of examples.

In a first example, the logic block 20 outputs correct data, i.e., it provides orthogonal or complementary output data A and A'. Accordingly, the exclusive OR gate 22 will output a logic "1" or HIGH value. In response to a logic "1" from gate 22, MOS transistors 36 and 38 will be rendered conductive, and MOS transistors 32 and 34 will be rendered nonconductive. As a result of transistors 36 and 38 being rendered conductive, a signal path is established from the output A of logic block 20 to the system output terminal Out via transistors 36 and 38. Further, as a result of transistors 32 and 34 being rendered non-conductive from the logic "1" output of gate 22, no signal path is established from the output A of the spare logic block 20A to the system output terminal OUT.

Thus, when the logic block 20 provides orthogonal, i.e., correct, output data, the output A of block 20 is provided as the system output OUT.

In a second example, the logic block 20 provides incorrect output data, i.e., it provides output data which is not orthogonal. As a result of logic block 20 providing incorrect output data, exclusive OR gate 22 will output a logic "0" or LOW value. A logic "0" output from gate 22 will cause transistors 36 and 38 to be rendered non-conductive, and will cause transistors 32 and 34 to be rendered conductive. Consequently, a signal path will be established from the output A of the spare logic block 20A to the system output terminal OUT via transistors 32 and 34. On the other hand, no signal path will be established from the output A of logic block 20 to the system output OUT.

Thus, when the logic block 20 fails to provide orthogonal or correct output data, system 10 operates such that the output A of the spare logic block 20A is provided as the system's output OUT.

In both of the examples provided above, exclusive OR gate 26 serves to detect the condition in which only one of the logic blocks 20 and 20A provides correct output data, and NOR gate 42 serves to detect the condition in which neither logic block 20 nor block 20A provides correct output data. Specifically, gate 26 will output a logic "1" only if one of the gates 22 and 24 outputs a logic "0" which signifies a fault in the output data. Thus, when gate 26 outputs a logic "1", it is known that only one of the logic blocks 20 and 20A provides correct, i.e., orthogonal, output data, and the other one of the blocks provides incorrect, i.e., non-orthogonal output data.

The NOR gate 42 will output a logic "1" only if the outputs of both gates 22 and 24 provide a logic "0". Thus, when NOR gate 42 outputs a logic "1", it is known that both logic blocks 20 and 20A provided incorrect, i.e., non-orthogonal output data.

In the embodiment shown in FIG. 1, the differential logic blocks 20 and 20a each provides a single pair of differential outputs; however, the system 10 can be expanded to the case where the differential logic blocks each provides N differential outputs. In this case, N 2-way multiplexers are required. Further, with N differential outputs, the Exclusive OR gates 22 and 24 must output a logic "1" only if all of the differential outputs are orthogonal. One way to achieve this is to provide an 2N-wide Exclusive OR gate if N is odd, or to provide an 2(N+1)-wide Exclusive OR gate if N is even. When N is odd, the Exclusive OR gate will output a logic "1" if all N differential outputs are orthogonal, and when N is even, the Exclusive OR gate will output a logic "1" if all N differential outputs are orthogonal and a dummy orthogonal differential input is provided.

Figure 2:
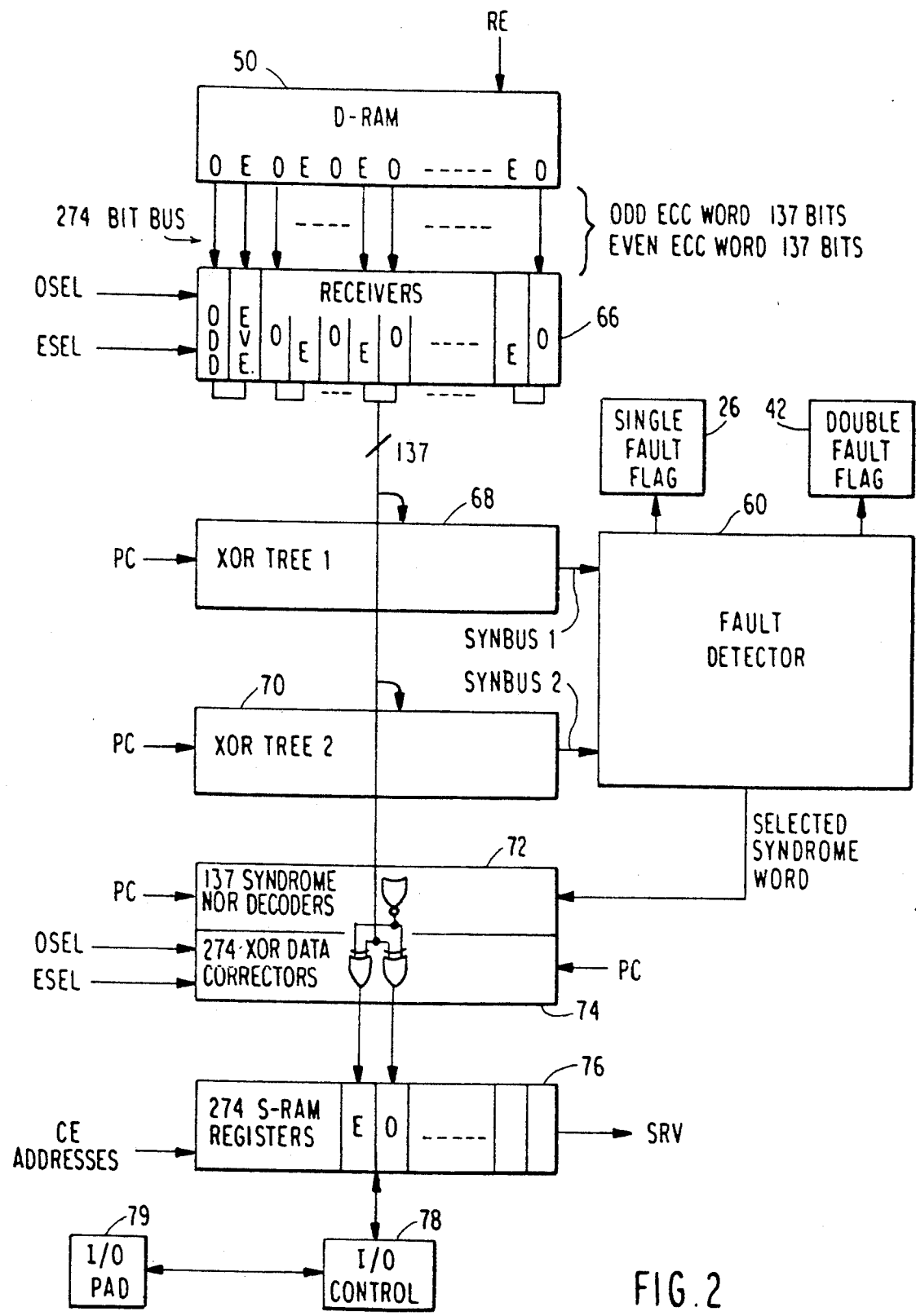
FIG. 2 is a block diagram showing a fetch operation of an error correction logic system according to a second embodiment of the invention.

FIGS. 2-5 show the logic system according to a second embodiment of the invention. This embodiment provides an ECC logic system which utilizes the fault tolerant logic system of FIG. 1. FIGS. 2-3 detail a fetch mode of operation for the ECC system, and FIGS. 4-5 detail a Write Back mode of operation for the ECC system.

As shown in FIG. 2, the ECC system includes a D-RAM 50, several receivers 66, first and second XOR trees 68 and 70 for generating first and second syndrome words, respectively, a fault detector 60, several syndrome decoders 72, several data correctors 74, several S-RAM registers 76, an I/O control circuit 78 and an I/O pad 79. The fetch mode operation for the ECC system shown in FIG. 2 will now be described with reference to the timing diagram shown in FIGS. 3(A)-3(E).

The D-RAM 50 stores two ECC words referred to as odd and even ECC words. Each of the ECC words contains 137 bits of which 128 are data bits, with the remaining 9 bits being check bits. Accordingly, the D-RAM stores 274 bits of information which comprise the odd and even 137 bit ECC words. In response to, for example, a read operation signal RE (FIG. 3(A)) goes LOW which results in signal PC becoming HIGH, as shown in FIG. 3(b). As shown in FIG. 2, signal PC is supplied to syndrome generators 68 and 70, syndrome decoder 72 and data corrector 74, and serves to activate these circuits.

Upon receiving a LOW signal RE, both 137-bit odd and even ECC words are driven from D-RAM 50 to the receivers 66 via the 274-bit PDL data bus. The receivers 66 serve to gate the odd or even ECC word stored in D-RAM 50 to the syndrome generators 68 and 70 in accordance with signals OSEL and ESEL. Specifically, the odd ECC word is gated to generators 68 and 70 in response to an active or HIGH signal OSEL, and the even ECC word is gated to generators 68 and 70 in response to an active signal ESEL. Preferably, the generation of signals OSEL and ESEL is determined from an address inputted by the user, with that word corresponding to the inputted address being gated first.

As shown in FIG. 3(C), it is assumed that signal OSEL is generated first. Accordingly, at this point of the fetch operation, the odd ECC word will be gated to the syndrome generators 68 and 70 which in response thereto generate respective 9-bit syndrome words SYN-BUS1 and SYNBUS2. The generated syndrome words each represents the result of a comparison between the 9-bit check bits stored in the D-RAM 50 and the check bits generated in accordance with the 128 data bits of the odd ECC word. The syndrome generators 68 and 70 are each implemented as a differential logic network, preferably Differential Cascode Voltage Switch (DCVS) type logic network. Accordingly, each of the syndrome generators 68 and 70 will provide differential outputs. The two generated syndrome words SYNBUS 1 and SYNBUS2 are transferred to the fault detector 60 which corresponds to the fault tolerant logic network of FIG. 1.

The fault detector 60 detects whether one of the syndrome words is correct, i.e., whether each one of the differential outputs of the syndrome generators 68 or 70 is orthogonal, and will select a correct one of the syndrome words in accordance with the results of the orthogonal detection operation, as was described above in connection with FIG. 1.

The selected syndrome word is supplied to the syndrome NOR decoders 72 to locate a bad bit in the ECC word and to generate an error signal. The generated error signal is supplied to both the odd and even Exclusive OR data correctors 74, and signal OSEL is used to enable only the odd exclusive OR gates of the data correctors 74 which correct and output the odd ECC word to the odd locations of the S-RAM registers 76.

As the first ECC word (in this example, the odd ECC word) is transferred into the appropriate S-RAM registers, the signal SRV is generated, as shown in FIG. 3(E). In response to the generation of signal SRV, signal PC goes LOW, and a restore or clear operation for the syndrome generators 68 and 70 and blocks 72, 74 is performed. After a predetermined period of time, which corresponds to the time necessary to perform the restore operation for blocks 68 and 70, 72, 74 the other odd/even selection signal becomes active (ESEL in this example; see FIG. 3(D)), and therefore the other ECC word (even) is processed, corrected and steered to the other 137 (even) S-RAM registers in the same manner as was described above for the odd ECC word. The signal SRV is activated a second time (FIG. 3(E)) as the second (even) ECC word is transferred to the S-RAM 76. This transfer starts the restore operation again, i.e., signal PC becomes LOW. The signal PC will remain LOW until signal RE becomes HIGH which will initiate the write back operation.

The write back operation for the ECC system will now be described with reference to the block diagram of FIG. 4 and the timing diagrams of FIGS. 5(A)-5(G).

Figure 4:
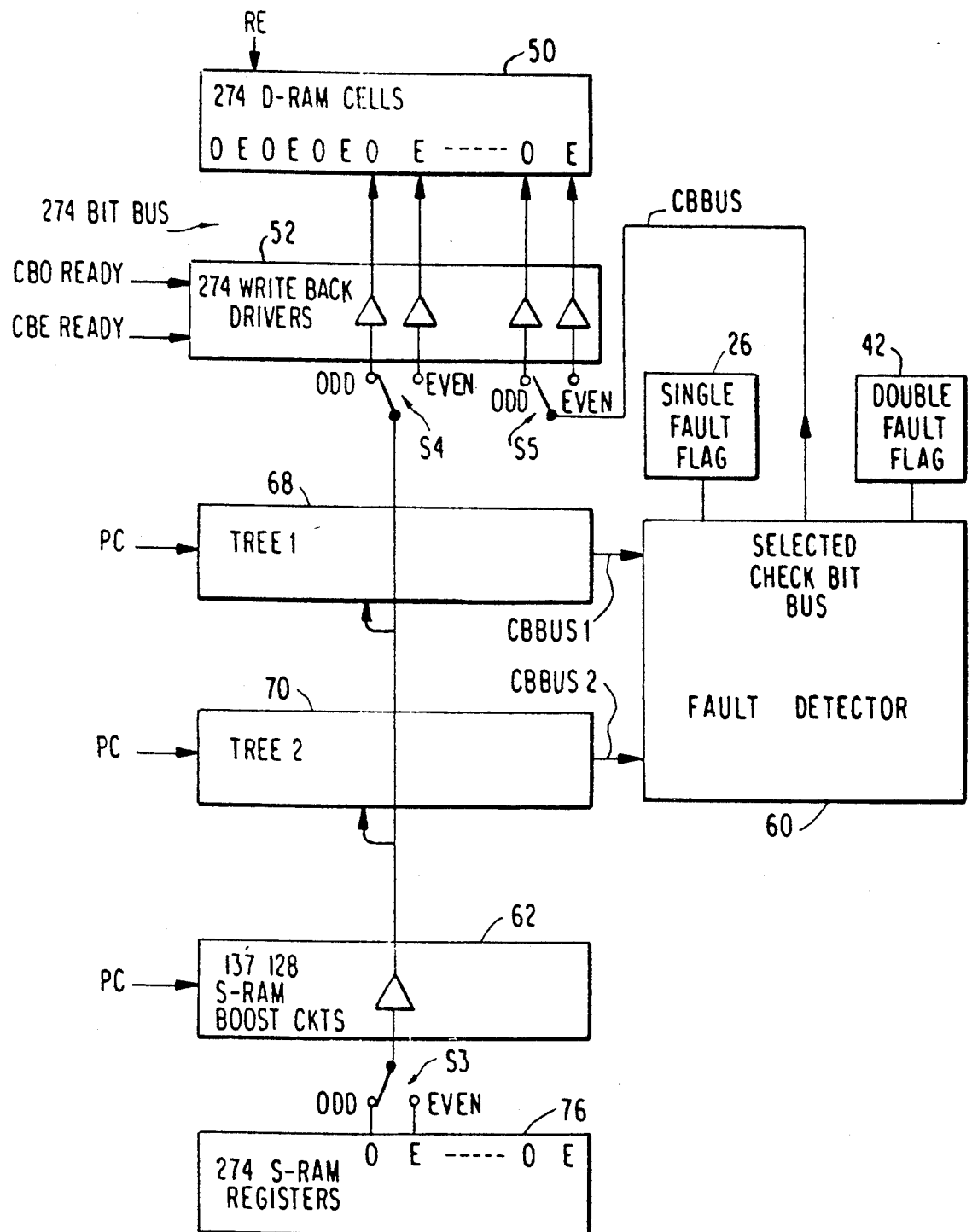
FIG. 4 is a block diagram showing a write back operation of an error correction logic system according to the second embodiment of the invention.

As shown in FIG. 4, the ECC system further includes several write back drivers 52 for writing information to the D-RAM 50, and an S-RAM driver circuit 62 for receiving an odd or even word stored in the S-RAM registers 76 and for supplying the received word to the syndrome generators 68 and 70.

In order to initiate a write back operation (which corresponds to, for example, a user-requested store operation) for the ECC system, signal RE becomes HIGH or active, as shown in FIG. 5(A). In response to signal RE becoming active, signal PC becomes high (FIG. 5(D)), and either signal OSEL or ESEL becomes active. In this example, it is assumed that signal OSEL becomes active (FIG. 5(B)) in response to signal RE becoming active. The signals OSEL and ESEL serve to control switches S3-S5 which operate to select between odd and even locations of the S-RAM registers 76 and the write back drivers 52. As indicated above, it is assumed that OSEL is activated first, and therefore switches S3-S5 are moved to their respective ODD terminals, as shown in FIG. 4.

In response to signal PC becoming high, the S-RAM driver circuits 62 are activated to drive the odd S-RAM data bits to the syndrome generators 68 and 70. That is, only the 128 data bits of the odd ECC word stored in the S-RAM registers are driven to the syndrome generators 68 and 70. The remaining 9-bit check bits of the odd ECC word stored in the S-RAM registers 76 are not driven to the DRAM 50. This is because these check bits may not be correct for the present data stored in the S-RAM registers 76, i.e., the data retrieved during the fetch mode operation may have been changed by the user, and therefore new check bits must be generated to reflect the change in the data.

Since syndrome generators 68 and 70 receive 128 data bits from the S-RAM driver circuits 62, and do not receive the 9-bit checks bits stored in the registers 76, syndrome generators 68 and 70 generate check bit words, rather than syndrome words. The generated check bit words are transferred to the fault detector 60 via lines CBBUS1 and CBBUS2. As discussed above, since generators 68 and 70 are implemented as differential logic circuits, pairs of differential outputs representing the check bit word are provided to the fault detector 60. The fault detector 60 first detects a correct check bit word, and then transfers the detected correct 9-bit check bit word to the write back drivers 52 via switch S5.

In response to check bit words being supplied to fault detector 60 via bus lines CBBUS1 and CBBUS2, signal CBBUS becomes active (FIG. 5(E)). Specifically, one of the pairs of differential outputs, i.e., True and Complement lines (T/C lines) are monitored to detect when a check bit word is being supplied to write back driver 50. In response to an active CBBUS signal, signal CBOREADY becomes active (FIG. 5(F)) to enable the write back drivers 52 which drive the 128 data bits and the selected 9-bit check word to the D-RAM 50. An active CBOREADY signal also serves to trigger a restore or clear operation of the generators 68, 70, i.e., signal PC becomes LOW, as shown in FIG. 5(D).

Upon completion of the restore operation of generators 68 and 70, the other odd/even selection phase becomes active (in this example signal ESEL becomes active (FIG. 5(C)) as PC goes high. The active ESEL signal serves to operate switches S3-S5 to their respective EVEN terminals, and the even ECC word is transferred to the D-RAM 50 in the same manner as was the odd ECC word. However, the signal CBEREADY (FIG. 5(G)) which serves to drive the even ECC word to the DRAM 50 becomes active in response to CBBUS becoming active and signal ESEL being active. The second restore operation of the generators 68 and 70 begins with the rise of CBREADY, i.e., signal PC becomes LOW.

The ECC logic system described above greatly increases chip manufacturing yields. This can be demonstrated by the following example.

In general, ECC logic generators can be produced with a yield $Y_{ECC}=0.8$, and after correcting the defective cells with the check bit code results in an array yield of $Y_{ARRAY}=0.90$. Thus, for a logic system which employs two ECC logic generators, the total yield is provided as: $Y_1=Y^2_{ECC}Y_{ARRAY}$ which results in a yield of 57.6%.

With the logic system described above, in which one of the two syndrome words or check bit words are selected, the yield would be expressed as $Y_2=(Y^2_{ECC}+2Y_{ECC}(1-Y_{ECC})Y_{ARRAY}$, which produces a yield of about 86.4%. Thus, the yield and manufacturing productivity are increased 86.4/57.6 = 1.5 times, for a total productivity increase of 50%. Similar improvements result in the chip reliability.

While the present invention has been particularly shown and described with reference to preferred embodiments thereof, it will be understood by those skilled in the art that various changes in form and details may be made therein with departing from the spirit and scope of the invention.

For example, while the fault detector 60 shown in FIGS. 2 and 4 serves to select one of two received words, the system can be modified such that the fault detector 60 receives more than two words. In this case, the fault detector 60 would not simply monitor one word but, rather, would monitor several words in order to select a correct word.

As another example, two fault detectors could be run in parallel with the outputs of the two fault detectors being supplied to a third fault detector which selects the correct word from the two parallel fault detectors. In either of these examples, the accuracy of the selected word would be increased relative to the logic system shown in FIGS. 2 and 4.

Moreover, while the invention has been discussed with reference to ECC, it can be utilized in a parity generator, a horizontal-vertical parity system or in any other system used to detect and/or correct erroneous data on-chip.

What we claim is:

1. A logic system comprising:
   first logic means for providing first differential outputs;
   second logic means for providing second differential outputs, said second logic means being redundant to said first logic means;
   fault detection means, coupled to said first logic means, for detecting a fault only in the first differential outputs; and
   selection means, coupled to said first and second logic means and to said fault detection means, for selecting an output of one of said first and second logic means in accordance with whether said fault means detects a fault.

2. The logic system as defined in claim 1, wherein said selection means selects an output of said second logic means only if said fault detection means detects a fault in the first differential outputs.

3. The logic system as defined in claim 1, wherein said fault detection means comprises an exclusive OR gate.

4. The logic system as defined in claim 1, wherein said selection means comprises a multiplexer.

5. The logic system as defined in claim 1, further comprising first detecting means for detecting a fault in one of said first and second differential outputs.

6. The logic system as defined in claim 5, wherein said first detecting means comprises an exclusive OR gate.

7. The logic system as defined in claim 5, further comprising second detecting means for detecting a fault in the first and second differential outputs.

8. The logic system as defined in claim 7, wherein said second detecting means comprises a NOR gate.

9. A logic system comprising:
   first logic block means for providing first differential outputs;
   second logic block means for providing second differential outputs, said second logic block means being identical to said first logic block means;
   fault detection means, coupled to said first logic block, for detecting a fault in the first differential outputs; and
   selection means, coupled to said first and second logic block means and to said fault detection means, for selecting an output of one of said first and second logic block means in accordance with whether said fault detection means detects a fault;
   wherein said fault detection means comprises a first exclusive OR gate, and wherein the system further comprises a second exclusive OR gate coupled to receive the second differential outputs, a third exclusive OR gate coupled to receive the outputs of said first and second exclusive OR gates, and a NOR gate coupled to receive output of said first and second exclusive OR gates.

10. The logic system as defined in claim 9, wherein said selection means is a multiplexer coupled to receive the output of said first exclusive OR gate, coupled to receive one of the first differential outputs, and coupled to receive one of the second differential outputs.

11. An error correction system comprising:
    memory means for storing a multi-bit word;
    first generating means, coupled to receive the word stored in said memory means, for generating a first error detection word in accordance with the received word;
    second redundant generating means, coupled to receive the word stored in said memory means, for generating a second error detection word in accordance with the received word;
    fault detection means, coupled to said first generating means, for detecting a fault only in the first error detection word; and
    output means for selectively outputting one of said first and second error detection word in accordance with whether said fault detection means detects a fault.

12. The error correction system as defined in claim 11, wherein said first and second generating means each comprises a differential logic generator having at least one complementary pair of output terminals.

13. The error correction system as defined in claim 12, wherein said fault detection means detects whether said first generated error detection word is faulty by detecting whether outputs respectively provided on the complementary pair of output terminals are orthogonal to each other.

14. The error correction code system as defined in claim 11, wherein said fault detection means comprises an exclusive OR gate.

15. The error correction code system as defined in claim 11, wherein said output means comprises a multiplexer.

16. An error correction system comprising:
    memory means for storing a multi-bit word;
    first generating means, coupled to receive the word stored in said memory means, for generating a first error detection word in accordance with the received word;
    second generating means, coupled to receive the word stored in said memory means, for generating a second error detection word in accordance with the received word;
    fault detection means, coupled to said first and second generating means, for detecting a fault in the first error detection word; and
    output means for selectively outputting one of said first and second error detection word in accordance with whether said fault detection means detects a fault;
    wherein the multi-bit word stored in said memory means included a data word and check bits for the data word, wherein during a fetch operation in which said multi-bit word is fetched from said memory means, said first and second generating means each generates a syndrome word from the data word and the check bits for the data word, and wherein during a write operation in which a multi-bit word is to be written into said memory means, said first and second generating means each generates a check bit word from only the data word of the multi-bit word to be written into said memory means.

17. The error correction code system as defined in claim 11, wherein said memory means comprises a D-RAM for storing two multi-bit error correction code words.

18. A method for providing output data from a logic system comprising the steps of:

providing first differential outputs from a first logic network;
providing second differential outputs from a second logic network which is redundant to the first logic network;
detecting whether the first differential outputs are non-differential; and
selecting one of said first and second differential outputs in accordance with whether said detecting step detects that the first differential outputs are non-differential.

19. A method for detecting a fault in an error correction code system comprising the steps of:
storing a multi-bit word;
a first generating step for generating a first orthogonal syndrome word from a first generating means in accordance with the stored word;
a second generating step for generating a second orthogonal syndrome word from a second redundant generating means in accordance with the stored word;
detecting whether the first generated syndrome word is non-orthogonal; and
selectively providing one of said first said second syndrome words in accordance with whether said detecting step detects that the first generated syndrome word is non-orthogonal.

20. A method for detecting a fault in an error correction code system comprising the steps of:
storing a multi-bit word;
a first generating step for generating a first orthogonal syndrome word from a first generating means in accordance with the stored word;
a second generating step for generating a second orthogonal syndrome word from a second redundant generating means in accordance with the stored word;
detecting whether the first generated syndrome word is non-orthogonal; and
selectively providing one of said first said second syndrome words in accordance with whether said detecting step detects that the first generated syndrome word is non-orthogonal;
wherein said storing step includes storing a multi-bit word including a data word and a check bits for the data word, wherein during a fetch operation in which said multi-bit word is fetched, said first and second generating steps each generates a syndrome word from the stored data word and the stored check bits for the data word, and wherein during a write operation in which a multi-bit is to be stored, said first and second generating steps each generates a check bit word from only the data word of the multi-bit word to be stored.

* * * * *